United States Patent [19]

Cameron

[11] 4,360,879
[45] Nov. 23, 1982

[54] POWER MEASURING DEVICE

[75] Inventor: Larry E. Cameron, Sterling Heights, Mich.

[73] Assignee: The Valeron Corporation, Troy, Mich.

[21] Appl. No.: 182,227

[22] Filed: Aug. 28, 1980

[51] Int. Cl.³ .......................................... G01R 19/00
[52] U.S. Cl. ................................... 364/483; 364/493; 364/571; 324/142; 324/116
[58] Field of Search ............... 364/483, 493, 464, 465, 364/466, 571; 324/142, 116, 120; 340/870.04, 870.05, 870.24, 192

[56] References Cited

U.S. PATENT DOCUMENTS

| | | | |
|---|---|---|---|
| 3,780,273 | 12/1973 | Turrell | 364/483 |
| 3,961,257 | 6/1976 | Milkovic | 324/142 |
| 4,079,313 | 3/1978 | Callan | 324/142 |
| 4,096,436 | 6/1978 | Cook | 324/142 |
| 4,107,777 | 8/1978 | Pearson | 364/465 |
| 4,150,433 | 4/1979 | Kaniel | 364/571 |
| 4,233,590 | 11/1980 | Gilkeson | 340/870.04 |
| 4,253,151 | 2/1981 | Bouve | 364/493 |
| 4,261,037 | 4/1981 | Hicks | 364/483 |

FOREIGN PATENT DOCUMENTS

| | | |
|---|---|---|
| 1358218 | 7/1974 | United Kingdom . |
| 1519787 | 8/1978 | United Kingdom . |
| 2006443 | 5/1979 | United Kingdom . |
| 1546749 | 5/1979 | United Kingdom . |
| 1569087 | 1/1980 | United Kingdom . |
| 2025072 | 1/1980 | United Kingdom . |

OTHER PUBLICATIONS

*Analog-Digital Conversion Handbook*, Norwood, Mass. Analog Devices, Inc., Jun. 1972, with particular notice to pp. I-24 & I-24.

Miran Milkovic, "A Polyphase Microelectronic Watt-hour Meter", *Int. J. Electronics*, 1980, vol. 48, #3, 257-269.

*Primary Examiner*—Mark E. Nusbaum
*Assistant Examiner*—Michael R. Fleming
*Attorney, Agent, or Firm*—Gordon K. Harris, Jr.

[57] ABSTRACT

A power measuring device is disclosed featuring the capability of converting resistively coupled load current and voltage signals to a digital pulse train whose frequency is proportional to the instantaneous power drawn. The digital pulse train can be optically coupled to a microcomputer-based display or process controller for conversion of the pulse train frequency to a power consumption indicating signal.

6 Claims, 1 Drawing Figure

POWER MEASURING DEVICE

BACKGROUND OF THE INVENTION

1. Field of the Invention

The invention relates generally to power measuring and display apparatus. More specifically, the invention concerns a transformerless power measuring transducer with optical coupling to a utilization device.

2. Description of the Prior Art

This invention relates to improvements to a power measuring transducer and transformer coupling utilization or monitor device disclosed in U.S. Pat. No. 4,096,436, assigned to the same assignee as the instant invention. While performing more than adequately for its intended applications, the power monitoring apparatus described in the above patent requires isolation of the monitored load signals from the display device via bulky and expensive transformer coupling. Additionally, the transformer coupled power transducer signals require relatively complex analog to digital signal conversion apparatus to enable use of the power measuring device with a digital utilization device such as a microcomputer.

SUMMARY OF THE INVENTION

Therefore it is an object of this invention to provide a transformerless power measuring device capable of generating a digital signal related to power consumption at a monitored load that can be easily interfaced with processor-based measuring or control systems.

Accordingly, the invention comprises load current and voltage sensors resistively coupled to the load being monitored, the sensor outputs being coupled to the inputs of a multiplier. A predetermined reference offset signal is added to the multiplier output and the resultant signal is then coupled to a converter circuit for conversion to a pulse train signal having a frequency proportional to the power drawn by the monitored load. To provide isolation of the relatively high current or voltage signals at the load from instrumentation or other type devices utilizing the pulse train signal, an optical coupler is placed between the converter output and a signal regeneration amplifier used for coupling a regenerated pulse train signal related to consumed power to a utilization device such as a process controller or processor-based display system.

It is a feature of this invention that the power measuring device output is inherently immune to noise and can be therefore transmitted over relatively long distances.

It is a further feature of this invention that the power measuring device is capable of faster response times than those devices producing analog output signals, because no filtering of the pulse train output signal of the device is required in interfacing the output signal to a utilization device.

It is yet another feature of this invention that the power measuring device can be used to measure AC or DC power consumption without modification.

DRAWING

These and other objects and features of the invention will become apparent from a reading of a detailed description of a preferred embodiment taken in conjunction with the drawing comprising FIG. 1 which is a functional schematic of a power measuring device and typical utilization system constructed in accordance with the principles of the invention.

DETAILED DESCRIPTION

Figure 1:
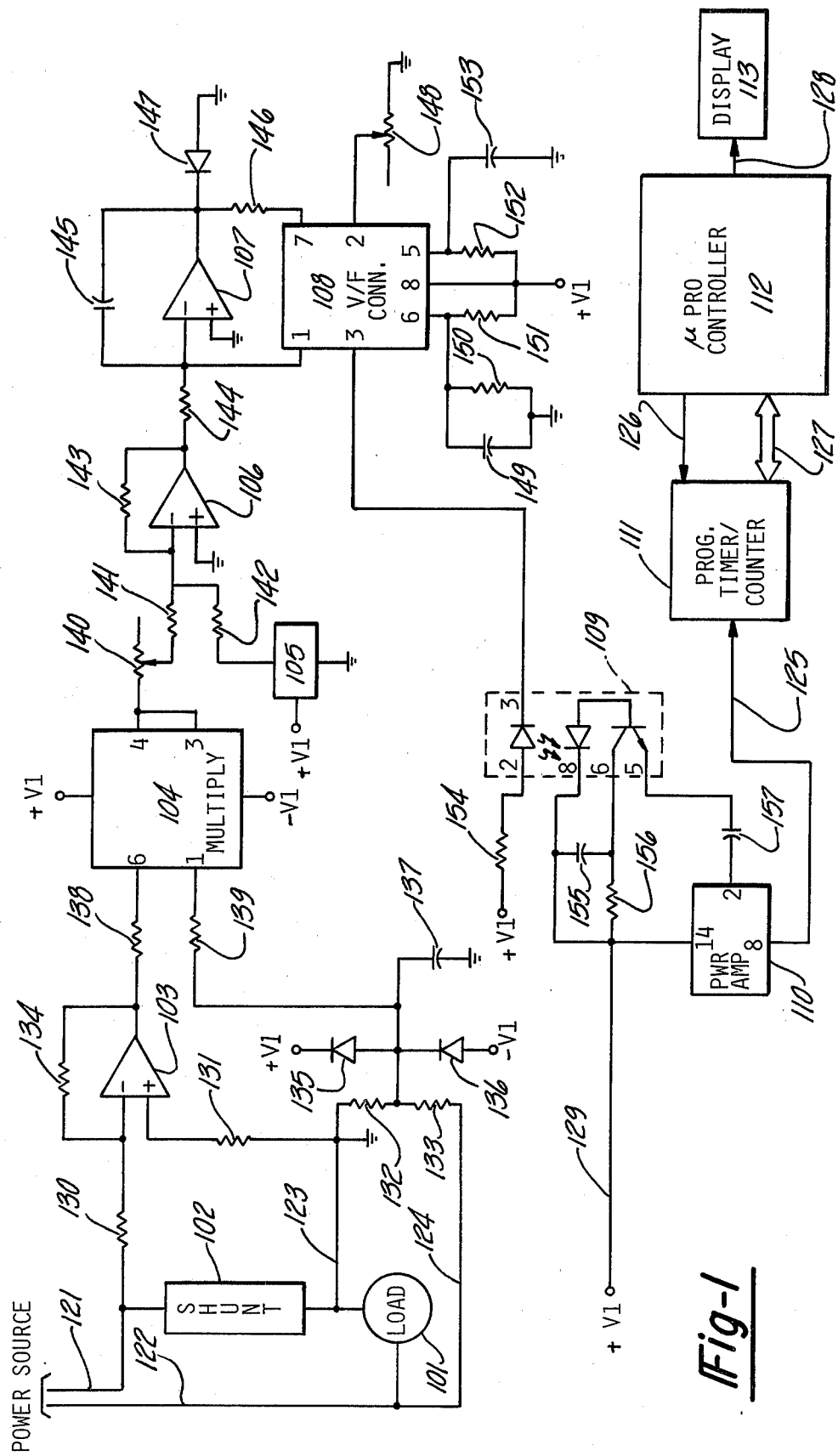

Referring to FIG. 1, a power source couples electrical power via lines 121 and 122 to an AC or DC load 101, such as the spindle motor of an electrically driven machine tool. A current measuring shunt 102 is placed in series with one power line 121 and the load 101.

A first signal proportional the voltage across load 101 is developed by a voltage divider network comprised of resistors 132 and 133, and a peak limiting circuit comprising diodes 135 and 136. A grounded terminal of load 101 is coupled via path 123 to a first terminal of resistor 132. Another terminal of load 101 is coupled via path 124 to a first terminal of resistor 133. Second terminals of resistors 132 and 133 are commonly connected to a point coupling an anode terminal of diode 135 to a cathode terminal of diode 136. A cathode terminal of diode 135 is coupled to a source of positive reference potential $+V1$, while an anode terminal of diode 136 is coupled to a source of negative reference potential $-V1$. The common connection point of resistors 132 and 133 and diodes 135 and 136 is additionally coupled to ground potential via filter capacitor 137 and to terminal pin 1 of analog signal multiplier circuit 104 via resistor 139. The first signal proportional to the voltage across the load 101 therefore appears at terminal pin 1 of multiplier 104.

A second signal proportional to the current being drawn by load 101 is developed via shunt 102 and operational amplifier 103. One side of shunt 102 is coupled via resistor 130 to an inverting input of amplifier 103. The inverting input of amplifier 103 is additionally coupled via resistor 134 to an output of amplifier 103. The other terminal of shunt 102 is coupled via path 123 and resistor 131 to a non-inverting input of amplifier 103. The output of amplifier 103 is coupled via resistor 138 to terminal pin 6 of multiplier 104. The second signal therefore appears at terminal pin 6 of multiplier 104.

Multiplier 104 generates the product of the first signal at terminal pin 1 and the second signal at terminal pin 6 and couples the product in the form of a third signal to output terminal pin 4. Multiplier 104 could, for example, comprise an integrated circuit chip type AD 532 commercially available from Analog Devices, Inc.

The output of multiplier 104 is coupled via over-all device gain adjusting resistor 140 to a signal summing circuit including input resistors 141 and 142, summing operational amplifier 106, and feedback resistor 143. Another input to the signal summing circuit is coupled to a reference offset signal source 105, which generates a precision offset voltage signal coupled to a first terminal of resistor 142 from input voltage supply $+V1$. Reference source 105 could, for example, be chosen as model AD 580, commercially available from Analog Devices, Inc. A wiper arm of variable resistor 140 is coupled via resistor 141 to a summing node at an inverting input of amplifier 106. Resistor 142 couples an output of offset reference 105 to the summing node at the inverting input of amplifier 106. A non-inverting input of amplifier 106 is coupled to ground potential. Resistor 143 is coupled between an output and the inverting input of amplifier 106. Hence a third signal formed by adding the offset signal load from source 15 and the output of multiplier 104 is generated at the output of amplifier 106.

The offset signal generated by source 105 is added to the output of multiplier 104 in order to enable use of the power measuring device disclosed herein in measuring power in three phase AC systems. The measurement of three phase power by the standard Two Wattmeter Method requires addition of two outputs of two power measuring devices, either of which outputs may go negative. Hence an offset signal is introduced in the measuring device to establish a voltage input level resulting in a device frequency output signal midway between negative and positive full scale readings when the power being measured is zero. Hence with zero power consumed at load 101, the third signal will have an amplitude substantially equal to the reference level of source 105 for coupling to a voltage to frequency converter to be described below.

The third signal is coupled to a precision voltage to frequency converter via resistor 144. The voltage frequency converter 108 utilizes an integrator comprised of capacitor 145 and operational amplifier 107 to initiate the converter timing cycle. Converter 108 could, for example, comprise model LM 331 and operational amplifier could comprise model LM 108, both commercially available from National Semiconductor Corp. Converter 108 and integrator amplifier 107 are configured in a known fashion fully described in the data sheets for converter 108, and the operational internal function of converter 108 will therefore not be set forth in detail herein. It is sufficient to note, for the purposes of the instant invention, that voltage to frequency converter 108 accepts the third signal via resistor 144 and integrator amplifier 107 at terminal pin 7 of converter 108 and generates a serial pulse train at output pin 3 having a frequency precisely proportional to the input voltage at terminal pin 7.

Resistor 144 couples the output of summing amplifier 106 to an inverting input of amplifier 107 and to terminal pin 1 of voltage to frequency converter 108. A non-inverting input of amplifier 107 is coupled to ground potential. Capacitor 145 is coupled between the inverting input and an output of amplifier 107. The output of amplifier 107 is coupled via a cathode to anode circuit of diode 147 to ground potential and via resistor 146 to terminal pin 7 of voltage to frequency converter 108.

Frequency adjusting variable resistor 148 is coupled between ground potential and terminal pin 2 of converter 108. Timing capacitor 153 is coupled between ground potential and terminal pin 5 of converter 108. Terminal pin 5 is coupled to positive DC source +V1 via timing resistor 152. Terminal pin 8 of converter 108 is coupled to DC source +V1, while terminal pin 6 of converter 108 is coupled to +V1 via resistor 151 and to ground potential via the parallel combination of resistor 150 and capacitor 149.

The pulse train signal at terminal pin 3 of converter 108 is coupled to terminal pin 3 of optical coupled 109, through a light emitting diode in the optical coupler unit to terminal pin 2 thereof, thence to DC source +V1 via resistor 154. Optical coupler 109 could, for example, be selected to be model 6N 135, commercially available from Hewlett Packard. The optical coupler 109 provides a means for isolating a utilization device, such as microprocessor controller 112 to be discussed below, from voltage and current levels associated with load 101.

The output of coupler 109 is coupled to power amplifier 110 for regeneration and shaping of the pulse train signal. Amplifier 110 could, for example, comprise type LM 380, commercially available from National Semiconductor Corp. Terminal pin 8 of coupler 109 is coupled to terminal pin 14 of amplifier 110 and, via path 129 to DC source +V1. Terminal pin 6 of coupler 109 is coupled via resistor 156 to terminal pin 14 of amplifier 110. Terminal pin 5 of coupler 109 is coupled to ground potential. Capacitor 155 is coupled between terminal pins 6 and 8 of coupler 109, while capacitor 157 is coupled between terminal pin 6 of coupler 109 and terminal pin 2 of amplifier 110.

The regenerated, reshaped pulse train signal is coupled from output terminal pin 8 of amplifier 110 to a utilization device comprised of an input counter 111, a microprocessor-based controller 112 and a display unit 113. Terminal pin 8 of amplifier 110 is coupled via path 125 to an input of a counting circuit 111, which could, for example, comprise a programmable timer type 6840, commercially available from Motorola. A suitable address and data bus 127 couples the contents of counter 111 to a microcomputer in controller 112, which could be selected as a model 6802, also commercially available from Motorola.

Microcomputer-based controller 112 can, under programmed control, periodically read the contents of counter 111 via bus 127 by coupling a read request signal via control line 126. By reading the counter contents periodically at predetermined constant time intervals, the pulse train signal frequency may be converted by controller 112 into a power consumption indicating signal for coupling via path 128 to display unit 113, which, for example, could provide a visually perceptible indication of the power being drawn by load 101.

It should be noted that the invention described herein has been illustrated with reference to a particular embodiment. It is to be understood that many details used to facilitate the description of such an embodiment are chosen for convenience only and without limitation on the scope of the invention, which is to be limited solely by the scope and spirit of the appended claims.

I claim:

1. Apparatus for determining average power consumption by an electrical load comprising:
   means resistively coupled to the load operative to generate first and second electrical signals respectively proportional to the voltage across and the current through the load;
   multiplier means coupled to the means to generate the first and second signals, operative to generate at a multiplier means output a third signal proportional to the product of the first and second signals;
   a reference offsset signal source and signal summing means coupled to the reference offset signal source and to the multiplier means output for combining a reference offset signal with the third signal, the reference offset signal having a magnitude and polarity such that the combined reference offset signal and third signal will have a constant polarity regardless of the polarity of the third signal;
   converter means coupled to the signal summing means operative to generate a pulse train signal having a frequency proportional to the amplitude of the combined reference offset signal and third signal; and
   utilization means including counter means having a counting input coupled for receipt of the pulse train signal, and microcomputer means coupled to the counter means, operative to periodically read contents of the counter means at predetermined time intervals and to convert the read contents into an average power consumption indicating signal that is a function of the frequency of the pulse train signal.

2. Apparatus as set forth in claim 1 further including optical coupling means for isolating the utilization means from voltage and current levels associated with the load, the optical coupling means coupled between the converter means and the utilization means.

3. Apparatus as set forth in claim 2 further including amplifier means having an input coupled to the optical coupling means and an output coupled to the utilization means and operative to regenerate a pulse train signal received from the optical coupling means at a level suitable for use by the utilization means.

4. Apparatus as set forth in claim 1 wherein the signal summing means further comprises amplifier means having a summing node input commonly coupled to the reference offset signal source and to the multiplier means output, and an output coupled to an input of the converter means.

5. The apparatus of claim 4 wherein the magnitude of the reference offset signal is such that the frequency of the pulse train signal generated by the converter means will lie substantially midway between frequencies respectively corresponding to negative and positive full scale representations of the power consumption being determined whenever the amplitude of the third signal is substantially zero.

6. The apparatus of claim 1 further comprising display means coupled to the microcomputer means for receipt of the power consumption indicating signal and including means for sensibly displaying an interpretation of the power consumption indicating signal.

* * * * *